(12) United States Patent
Yeh et al.

(10) Patent No.: US 6,476,448 B2
(45) Date of Patent: Nov. 5, 2002

(54) FRONT STAGE PROCESS OF A FULLY DEPLETED SILICON-ON-INSULATOR DEVICE AND A STRUCTURE THEREOF

(75) Inventors: Wen-Kuan Yeh, Chupei; Hua-Chou Tseng, Hsinchu; Jiann Liu, Taipei, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/759,971

(22) Filed: Jan. 12, 2001

(65) Prior Publication Data

US 2002/0093054 A1 Jul. 18, 2002

(51) Int. Cl.$^7$ ...................... H01L 27/088; H01L 27/092
(52) U.S. Cl. ......................... 257/351; 257/350
(58) Field of Search ................. 257/350, 351, 257/353

(56) References Cited

U.S. PATENT DOCUMENTS 5,670,397 A * 9/1997 Chang et al. ............... 438/226
6,252,283 B1 * 6/2001 Gardner et al. ............. 257/351
6,384,447 B2 * 5/2002 Mihnea et al. .............. 257/314
2002/0011622 A1 * 1/2002 Keshavarzi et al. ........ 257/314

* cited by examiner

Primary Examiner—Allan R. Wilson
(74) Attorney, Agent, or Firm—J.C. Patents (57) ABSTRACT

The front-stage process of a fully depleted SOI device and the structure thereof are described. An SOI substrate having an insulation layer and a crystalline silicon layer above the insulation layer is provided. An isolation layer is formed in the crystalline silicon layer and is connected to the insulation layer to define a first-type MOS active region. An epitaxial suppressing layer is formed above the crystalline silicon layer outside of the first-type MOS active region. A second-type doped epitaxial silicon layer is selectively formed above the crystalline silicon layer in the first-type MOS active region. The second-type doped epitaxial layer is doped in-situ. An undoped epitaxial silicon layer is selectively formed above the second-type doped epitaxial silicon layer. The epitaxial suppressing layer is then removed.

5 Claims, 6 Drawing Sheets

FRONT STAGE PROCESS OF A FULLY DEPLETED SILICON-ON-INSULATOR DEVICE AND A STRUCTURE THEREOF

BACKGROUND OF THE INVENTION

1. Field of the Invention

The present invention relates to a front stage process of an active device within an integrated circuit, and the structure thereof More particularly, the present invention relates to the front stage process of a fully depleted silicon-on-insulator (SOI) device, and the structure thereof.

2. Description of the Related Art

Silicon-on-insulator (SOI) devices are semiconductor devices of the new era. The SOI substrate structure comprises an insulator and a crystalline silicon layer above the insulator. The device is fabricated above the crystalline silicon layer. Compared to Metal Oxide Semiconductors (MOS) fabricated on bulk silicon substrates, SOI metal oxide semiconductors (MOS) possess the following advantages:

1.) The electrical consumption of SOI-MOS is much lower because the underside of the crystalline silicon layer has an insulation layer that can prevent current leakage.

2. The threshold voltage (Vt) of the SOI-MOS is much lower because the crystalline silicon layer is very thin.

3. The performance of the SOI-MOS is much higher because the parasitic capacitance of the SOI-MOS source/drain region is very small.

SOI-MOS are differentiated based on their operating state. The two kinds include partially depleted mode and fully depleted mode SOI-MOS. The special characteristic of fully depleted SOI-MOS is that the crystalline silicon layer above the insulation layer is very thin. Consequently, the entire area, from the bottom of the channel region to the insulation layer, becomes a depleted region when the SOI-MOS operates.

Compared to partially depleted SOI-MOS, the electrical consumption and threshold voltage of fully depleted SOI-MOS are both much lower. Moreover, the performance is much higher.

Figure 1A:
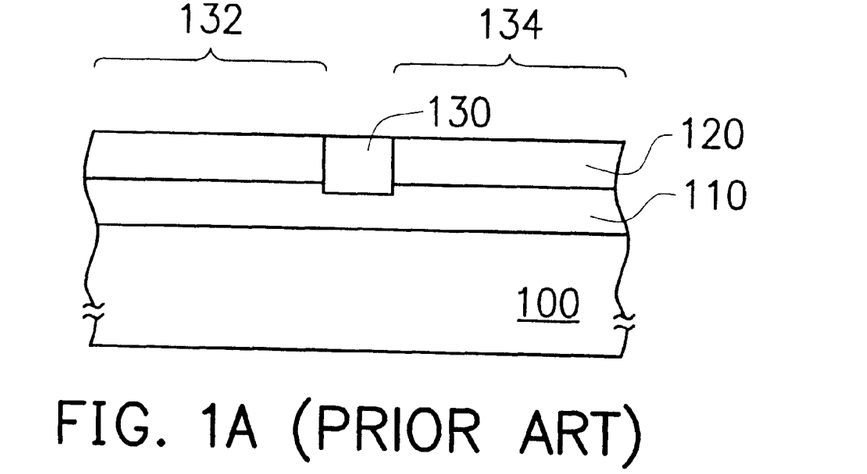
Figure 1B:
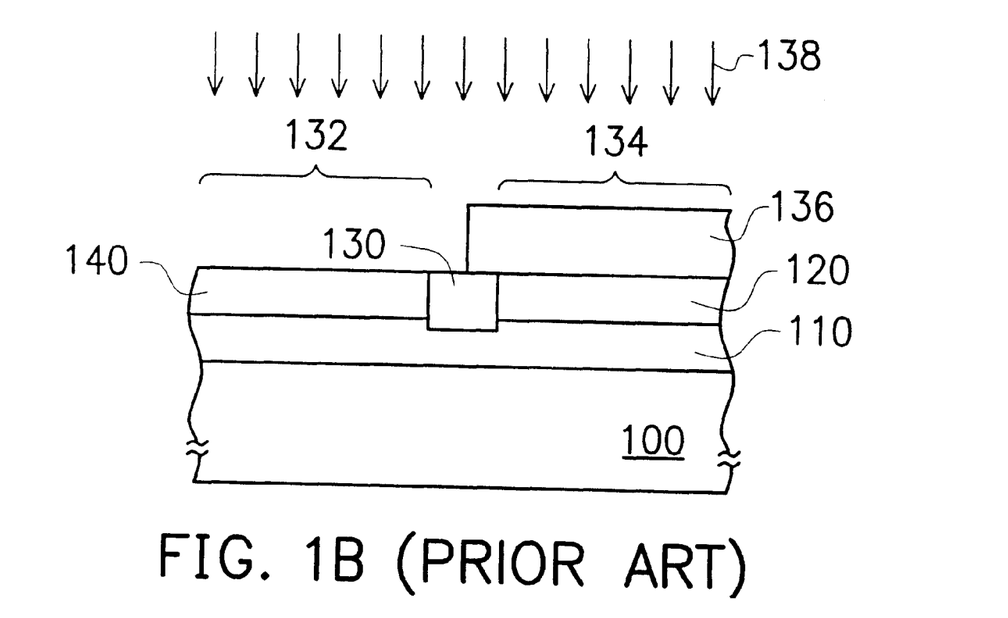

The fabrication steps of the conventional SOI-MOS are summarized below. As shown in FIG. 1A, a silicon-on-insulation (SOI) substrate 100 is provided, wherein the insulation layer comprises a silicon oxide layer 110 and a crystalline silicon layer 120 overlying the silicon oxide layer 110. One method for fabricating the SOI substrate 100 includes implanting oxide ions into a silicon substrate and performing a thermal step to cause the ions and the oxide to react, resulting in the formation of silicon the oxide layer 110. The silicon material on the surface forms the crystalline silicon layer 120. A silicon oxide isolation layer 130 connected to the silicon oxide layer 110 is formed in crystalline silicon layer 120, to define PMOS active region 132 and NMOS active region 134. As shown in FIG. 1B, NMOS active region 134 is covered with a photoresist layer 136. Using the photoresist layer 136 as a mask, n-type doped ions 138 are implanted into crystalline silicon layer 120 within PMOS active region 132, converting the crystalline silicon layer 120 within PMOS active region 132 into an n-type doped well 140.

Figure 1C:
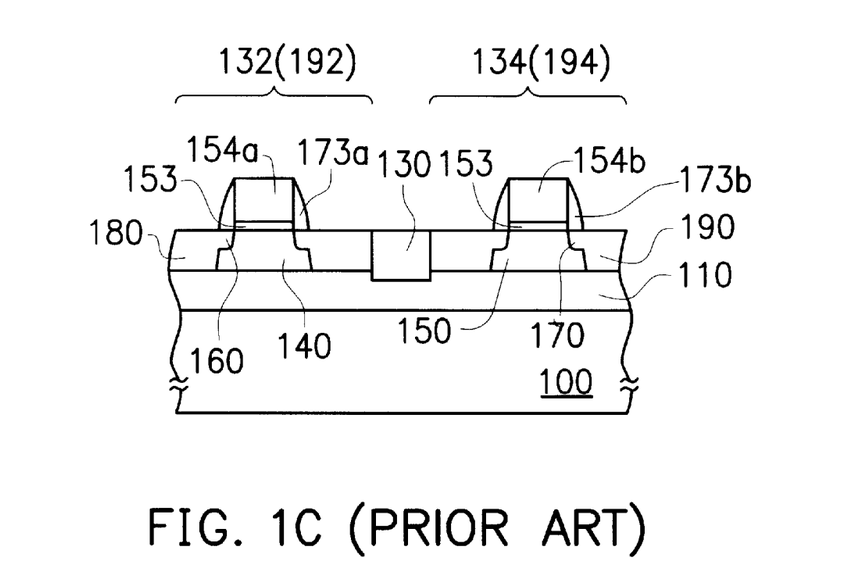

As shown in FIG. 1C, the photoresist layer 136 is removed. The PMOS active region 132 is then covered by a photoresist layer 146. Using the photoresist layer 146 as a mask, p-type ions 148 are implanted into the crystalline silicon layer 120 within NMOS active region 134, converting the crystalline silicon layer 120 in the NMOS active region 134 into a p-type doped well 150.

Figure 1D:
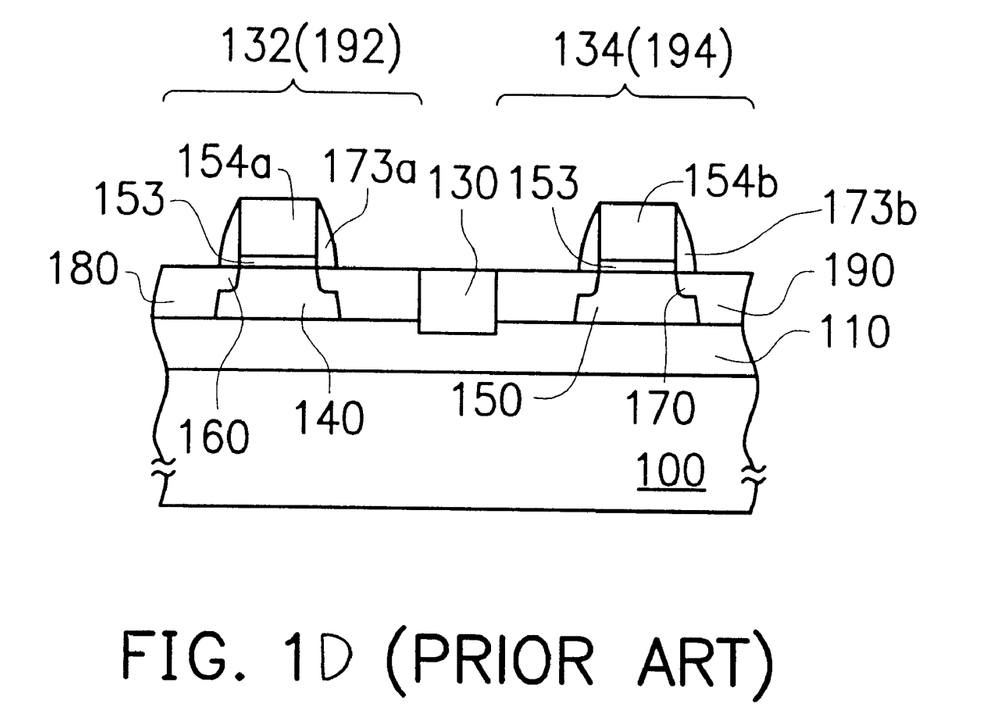

As shown in FIG. 1D, the photoresist layer 146 is removed. A gate oxide layer 153 is then formed above the n-type doped well 140 (p-type doped well 150). Gates 154a and 154b are then formed above gate oxide layer 153. A p-type lightly doped drain 160 is formed in n-type doped well 140 on opposite sides of gate 154a. Similarly, an n-type lightly doped drain 170 is formed in p-type doped well 150 on opposites sides of gate 154b. Spacers 173a and 173b are then formed on the sidewalls of gates 154a and 154b, respectively. A p-type source/drain region 180 is then formed in the n-type doped well 140 beside the spacer 173a. Similarly, an n-type source/drain region 190 is formed in the p-type doped well 150 on an exterior side of the spacer 173b. This step completes the fabrication of a p-type (n-type) fully depleted SOI device 192 (194).

Figure 2:
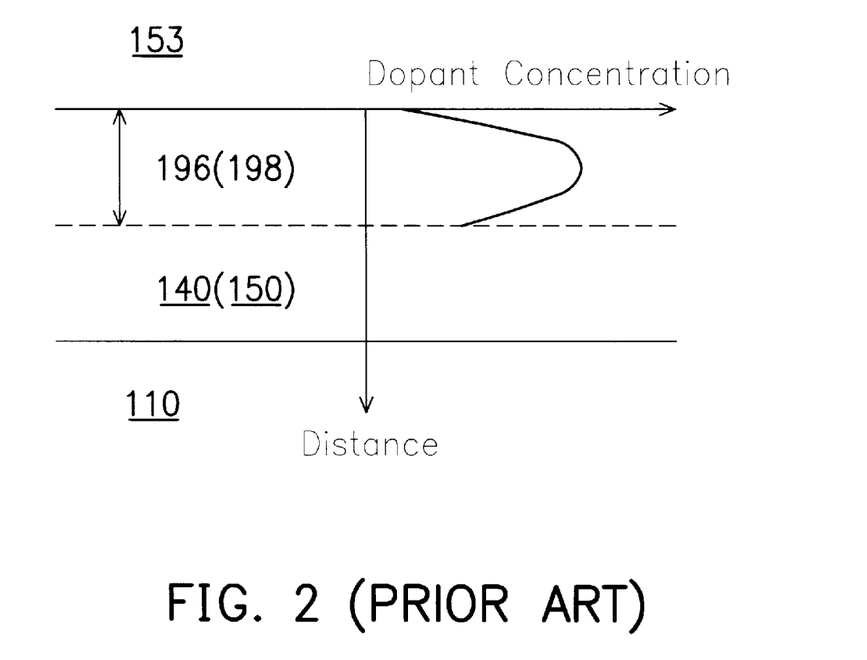
FIG. 2 is a schematic drawing illustrating the ideal channel doping distribution (referred to herein as the delta doping) of a conventional fully depleted MOS device.

FIG. 2 shows the ideal doping distribution within channel region 196 (198) of the p-type (n-type) SOI device achieved by the conventional fabrication method. In the channel region 196(198), shown above the dotted line, the doping concentration of the area near the gate oxide layer 153 is much lower, in order to lower the threshold voltage. The doping concentration of the central portion of the channel region is the highest, to enhance the anti-punch through effect. The doping distribution of the channel region 196 (198) is referred to as "delta doping".

As the dimensions of electronic devices grow increasingly smaller, the thickness of crystalline silicon layer 120 above silicon oxide layer 110 becomes thinner. In advanced fabrication processes, the thickness of the crystalline silicon layer 120 can fall between 200 Å and 500 Å, causing the following disadvantages of the p-type (n-type) fully depleted SOI device:

1. The crystalline silicon layer 120 is very thin. Thus, when ions are implanted into the crystalline silicon layer 120, to form the n-type and the p-type wells 140 and 150, the doping distribution is very difficult to control. Consequently, the threshold voltage and source/drain resistivity are unstable. Moreover, the channel region 196 (198) does not easily attain the ideal delta doping distribution as shown in FIG. 2.

2. Because the crystalline silicon layer 120 is extremely thin, the p-type lightly doped drain 160 and the n-type lightly doped drain 170 are difficult to form.

3. Because crystalline silicon layer 120 is extremely thin, the self-aligned silicide, formed above the p-type (n-type) source/drain regions 180 (190) in a subsequent step, will consume a large portion of silicon in the crystalline silicon layer 120, which compromises the junction integrity of the p-type (n-type) source/drain regions 180 (190).

4. When high temperature is applied to the oxide ions in the SOI substrate fabrication method discussed above, the distribution range of implanted oxide ions is very wide (relative to the thickness of crystalline silicon layer 120). This causes the crystalline silicon layer 120 to contain a rather large amount of oxide atoms. As a consequence, the quality of the self-aligned silicide formed above the p-type (n-type) source/drain regions 180 (190) is lowered.

SUMMARY OF THE INVENTION

The invention provides a front stage process for a fully depleted SOI having the following steps: an SOI substrate with an insulation layer and a crystalline silicon layer above the insulation layer is provided. An isolation layer connected to the insulation layer is formed, to define a first-type MOS active region. The first-type is either p-type or n-type. An epitaxial suppressing layer is formed above the crystalline silicon layer outside of the first-type MOS active region. A second-type doped epitaxial silicon layer is then selectively formed above the crystalline silicon layer in the first-type MOS active region. This second-type doped epitaxial silicon layer is doped in-situ. An undoped epitaxial silicon layer is then selectively formed above the second-type doped epitaxial silicon layer. The epitaxial suppressing layer is then removed.

The invention provides a fully depleted SOI device front stage process used in the fabrication process for a co-existing PMOS and NMOS. The steps of the front stage process are as follows: an SOI substrate having an insulation layer and a crystalline silicon layer above the insulation layer are provided. An isolation layer connected to the insulation layer is formed in the crystalline silicon layer, in order to define a first-type MOS active region and a second-type MOS active region. A first epitaxial suppressing layer is formed over the crystalline silicon layer in the second-type MOS active region. A second-type doped epitaxial silicon layer is then selectively formed above the crystalline silicon layer in the first-type MOS active region. This second-type doped epitaxial silicon layer is doped in-situ. A first undoped epitaxial silicon layer is then selectively formed above the second-type doped epitaxial silicon layer. The first epitaxial suppressing layer is removed, to expose the crystalline silicon layer in the second-type MOS active region.

A second epitaxial suppressing layer is then formed above the first undoped epitaxial silicon layer in the first-type MOS active region. A first-type doped epitaxial silicon layer is selectively formed above the crystalline silicon layer in the second-type MOS active region. This first-type doped epitaxial silicon layer is doped in-situ. A second undoped epitaxial silicon layer is then selectively formed above the first-type doped epitaxial silicon layer. The second epitaxy suppressing layer is then removed to expose the first undoped epitaxial silicon layer in the first-type MOS active region.

The invention provides a bottom level structure of fully depleted SOI device comprising an SOI substrate, an isolation layer, a second-type doped epitaxial silicon layer and a second type lightly doped epitaxial silicon layer. The SOI substrate comprises an insulation layer and a crystalline silicon layer formed above the insulation layer. The isolation layer is formed in the crystalline silicon layer and is connected to the insulation layer, to define a first-type MOS active region. The second-type doped silicon layer is above the crystalline silicon layer in the first-type MOS active region. The doping concentration throughout the second-type doped silicon layer is roughly the same. The second-type lightly doped epitaxial silicon layer is above the second-type doped epitaxial silicon layer. The doping concentration of the second-type lightly doped epitaxial silicon layer is far lower than the second-type doped epitaxial silicon layer. Moreover, the second-type lightly doped epitaxial silicon layer has a special doping profile. This special doping profile is caused by the diffusion of dopant from the second-type doped epitaxial silicon layer.

In the front stage process and bottom level structure of the fully depleted device of the present invention, the thickness of the crystalline silicon layer is between 200 Å and 500 Å. The thickness of the first-type and second-type doped epitaxial silicon layer is between 50 Å and 100 Å. The thickness of the undoped epitaxial silicon layer and the second-type lightly doped epitaxial silicon layer is also between 50 Å and 100 Å. Additionally, if both the NMOS and PMOS are present, the first doping type can be n-type or p-type and the second doping type can be p-type or n-type.

The dopant in the upper undoped epitaxial silicon layer and lower crystalline layer diffuses out only through the medial first-type doped epitaxial silicon layer, according to the front stage process of the present invention. Thus, the doping concentration of the undoped epitaxial silicon layer and the crystalline silicon layer is far lower than that of the first-type doped epitaxial silicon layer. Consequently, the doping distribution in the channel region of the present invention approaches the ideal "delta doping" condition. That is to say, the device has a low threshold voltage and excellent anti-punch through ability. Additionally, the first-type epitaxial silicon layer is doped in-situ. Moreover, the dopant of the undoped epitaxial silicon layer is diffused from the first-type doped epitaxial silicon layer. Consequently, the doping profile of the channel region is easy to control, which enables the threshold voltage and the source drain/drain resistivity to remain stable.

The first-type epitaxial silicon layer and the undoped epitaxial silicon layer above the crystalline silicon layer increase the thickness of the entire silicon layer. Consequently, the lightly doped drain, fabricated in a subsequent step, is much easier to form.

When the silicide is formed above the lightly doped source/drain regions of the MOS, the first-type doped epitaxial silicon layer and undoped epitaxial silicon layer can provide more consumed silicon. Thus, the junction integrity of the source drain regions is not compromised.

The region in which the self-aligned silicide is formed comprises a doped epitaxial silicon layer and an undoped epitaxial silicon layer. The crystalline silicon layer in the SOI substrate is the only part that contains oxygen (resulting from the oxide ion implantation of the SOI substrate). Neither the doped epitaxial silicon layer nor the undoped expitaxial silicon layers contain oxygen. Thus, the amount of oxygen contained in self-aligned silicide formed is relatively less. Consequently, the quality is much better.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention. In the drawings, FIGS. 1A–1D is a schematic drawing illustrating the fabrication process of a conventional fully depleted SOI device; wherein FIG. 1D illustrates the cross-sectional view of a conventional fully depleted SOI device;

FIGS. 3A–3E are schematic drawings illustrating the fabrication process of a fully depleted SOI device according to one preferred embodiment of this invention; wherein FIG. 3E is a schematic drawing illustrating the cross-sectional view the fully depleted SOI device of the present invention.

DESCRIPTION OF THE PREFERRED EMBODIMENTS

Figure 3A:
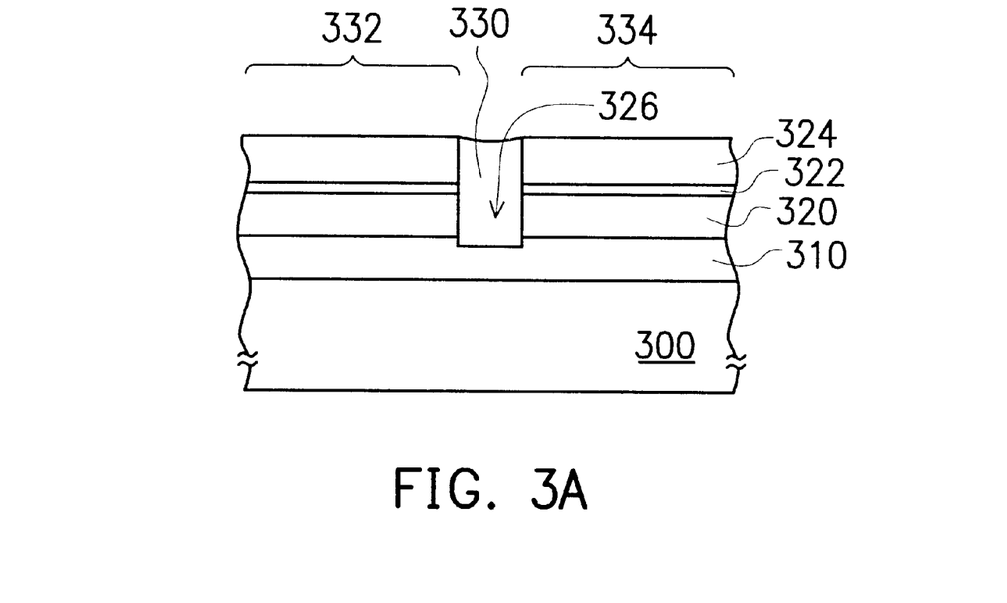

As shown in FIG. 3A, an SOI substrate 300 is provided. The SOI substrate 300 comprises an insulation layer 310 composed of silicon oxide and a crystalline silicon layer 320 above insulation layer 310. The thickness of crystalline silicon layer 320 lies between 200 Å and 500 Å. A pad oxide layer 320 and a mask layer 324 are sequentially formed above the crystalline silicon layer 320. The material of mask layer can be silicon nitride. The mask layer 324, the pad oxide layer 322, and the crystalline silicon layer are sequentially patterned to form trench 326 and expose a portion of insulation layer 310. The mask layer 324 is completely covered with an insulation material (the covered-state is not shown) to fill trench 326. The insulation material can be, for example, silicon oxide. The insulation layer on the exterior of trench 326 is removed, so that the remaining insulation material forms an isolation layer 320. The isolation layer 330 defines a PMOS active region 332 and an NMOS active region 334.

Figure 3B:
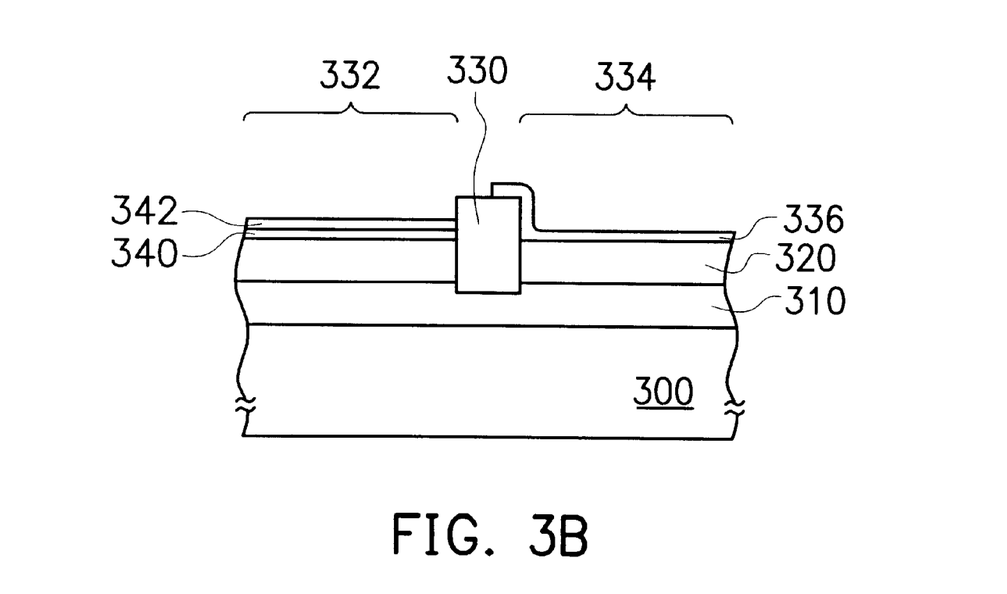

As shown in FIG. 3B, the mask layer 324 and the pad oxide layer 322 are sequentially removed. The crystalline silicon layer 320 in the NMOS active region 334 is covered by an epitaxial suppressing layer 336. The material of epitaxial suppressing layer 336 can be silicon oxide. Two epitaxial steps are performed to sequentially form n-type epitaxial layer 340 and undoped epitaxial silicon layer 342 above crystalline silicon layer 320 in PMOS active region 332. N-type epitaxial silicon layer is doped in-situ. Additionally, the thickness of n-type epitaxial silicon layer 340 and undoped epitaxial layer 342 is about 50 Å to about 100 Å.

Figure 3C:
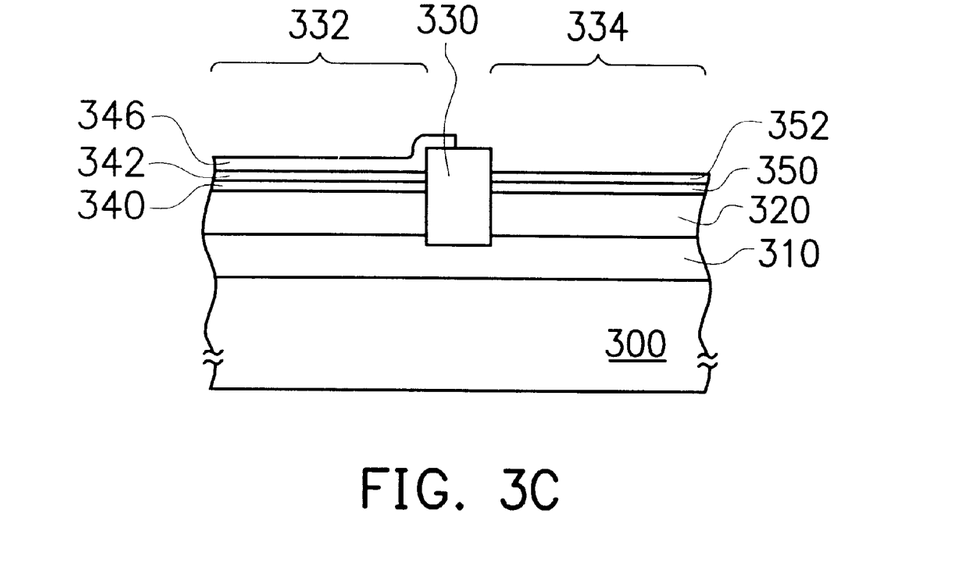

As shown in FIG. 3C, epitaxial suppressing layer 336 is removed to expose the crystalline silicon layer 320 in the NMOS active region 334. The undoped epitaxial silicon layer 342 in the PMOS active region 332 is covered by an epitaxial suppressing layer 346. The material of the epitaxial suppressing layer 346 can be silicon oxide, for example. Two epitaxial steps are conducted to sequentially form a p-type doped epitaxial silicon layer 350 and an undoped epitaxial silicon layer 352 above the crystalline silicon layer 320 in the NMOS active region 334. The p-type epitaxial silicon layer 350 is doped in-situ. Additionally, the thickness of the p-type epitaxial silicon layer 350 and the undoped epitaxial silicon layer 352 is about 50 Å to about 100 Å. Epitaxial suppressing layer 346 is removed, to expose the undoped epitaxial silicon layer 342 in the PMOS active region 332.

Figure 3D:
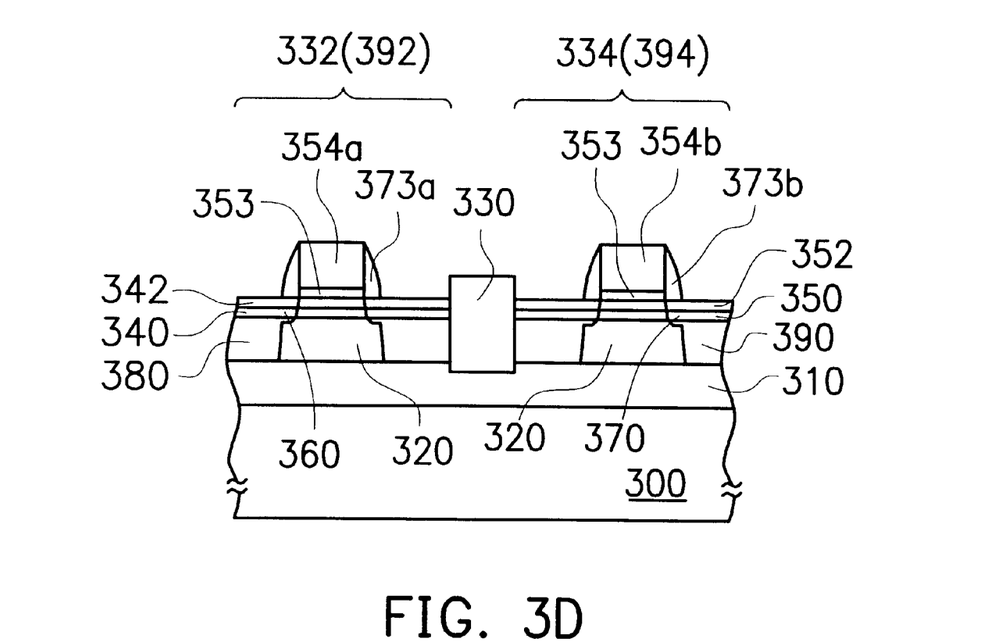

As shown in FIG. 3D, a gate dielectric 353 is formed above t the undoped epitaxial silicon layer 342 in the PMOS active region 332 and above the undoped epitaxial silicon layer 352 in the NMOS active region 334. The gate dielectric 353 can be a gate oxide layer, for example. A gate 354a is formed above the gate dielectric layer 353 in the PMOS active region 332. Similarly, a gate 354b is formed above the gate dielectric layer 353 in the NMOS active region 334. A p-type lightly doped drain (p-LDD) 360 is then formed in the undoped epitaxial silicon layer 342, the n-type epitaxial silicon layer 340 and the crystalline silicon layer 320, on both sides of the gate 354a. Similarly, an n-type lightly doped drain (n-LDD) 370 is formed in the undoped epitaxial silicon layer 352, the p-type epitaxial silicon layer 350 and the crystalline silicon layer 320, on both sides of the gate 354b. A spacer 373a is formed on a sidewall of the gate 354b. A spacer 373b is then formed on a sidewall of gate 354b. A p-type source/drain region 380, connected to insulation layer 310, is formed in the undoped epitaxial silicon layer 342, the n-type epitaxial silcon layer 340 and the crystalline silicon layer 320 on a side of spacer 373a. Similarly, an n-type source/drain region 390, connected to insulation layer 310 is formed in the undoped epitaxial silicon layer 352, the p-type epitaxial silicon layer 350 and the crystalline silicon layer 320 on a side of spacer 373b. This formation of p-type source/drain 380 and n-type source/drain 390 completes a p-type SOI MOS 392 and an n-type SOI MOS 394 according to a preferred embodiment of the present invention.

Figure 3E:
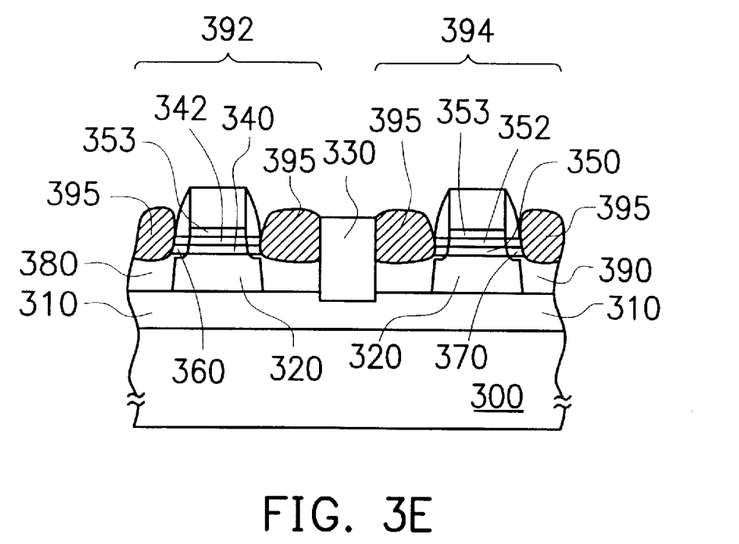

As shown in FIG. 3E, self-aligned silicide 395 is formed above p-type source/drain region 380 and n-type/source drain region 390 in order to increase the conductivity of the p- and n-type source/drain regions.

Figure 4:
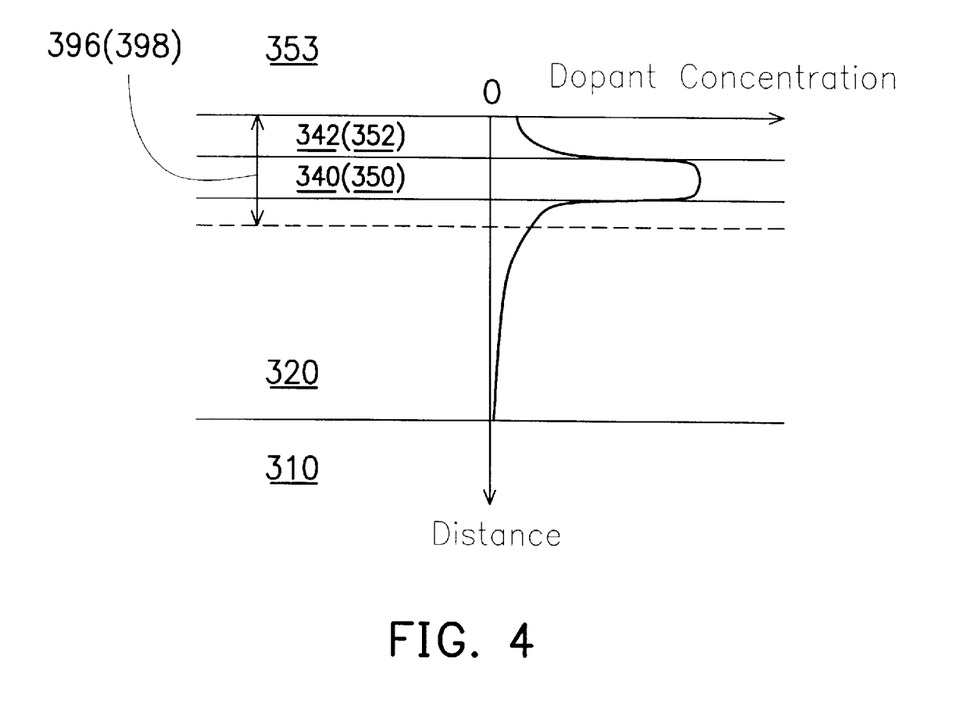
FIG. 4 is a schematic drawing illustrating the channel doping distribution according to a preferred embodiment of this invention.

The fabrication method and the fully depleted SOI device achieved by this method, as embodied and described herein, possess the following advantages:

FIG. 4 shows the delta doping of the channel of the fully depleted SOI device according to a preferred embodiment of this invention. In p-type (n-type) SOI complementary metal oxide semiconductors, the dopant in the undoped epitaxial silicon layer 342 (352) and the crystalline silicon layer (394) is only diffused from the n-type(p-type) epitaxial silicon layer 340 (350). Thus, the doping concentration of the undoped epitaxial silicon layer 342 (352) and the crystalline silicon layer 320 is far lower than that of the n-type(p-type) epitaxial silicon layer 340 (350). Consequently, the dopant distribution in the channel region 396 (398) of the p-type (n-type) SOI CMOS 392 (394) of the present invention approaches the ideal "delta doping" condition. That is to say, the device has a low threshold voltage and excellent anti-punch through ability. Additionally, the n-type (p-type) epitaxial silicon layers 340 (350) are doped in-situ. Moreover, the dopant of the undoped epitaxial silicon layers 342 (352) is diffused from the n-type (p-type) epitaxial silicon layer 340 (350). Consequently, the doping profile of the channel region is easy to control, which enables the threshold voltage and the source drain/drain resistivity to remain stable.

The n-type (p-type) epitaxial silicon layers 340 (350) and the undoped epitaxial silcon layers 342 (352) above the crystalline silicon layer 320 increase the thickness of the entire silicon layer. Consequently, the p-type (n-type) lightly doped drains 360(370) are much easier to form.

When self-aligned silicide 395 is formed above the p-type (n-type) source/drain regions 380 (390), the p-type (n-type) epitaxial silicon layer 340 (350) and the undoped epitaxial silicon layer provide a sufficient amount of silicon to consume. Thus, the junction integrity of the p-type (n-type) source/drain regions 380 (390) is not compromised.

The region in which the self-aligned silicide 395 is formed comprises n-type (p-type) epitaxial silicon layers 340 (350) and undoped epitaxial silicon layers 342 (352). The crystalline silicon layer 320 in SOI substrate 300 is the only part that contains oxygen. Neither n-type (p-type) epitaxial silicon layers 340 (350) nor undoped expitaxial silicon layers 342 (352) contain oxygen. Thus, the amount of oxygen contained in the self-aligned silicide formed is relatively less. Consequently, the quality is much better.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bottom level structure of a fully depleted SOI device, which is applicable to SOI substrate, comprising:

an SOI substrate comprising an insulation layer and crystalline silicon layer above the insulation layer;

an isolation layer in the crystalline silicon layer, wherein the isolation layer is connected to the insulation layer and defines a first-type MOS active region;

a second-type doped epitaxial silicon layer formed above the crystalline layer in the first-type MOS active region, and a second-type lightly doped epitaxial silicon layer above the second-type doped epitaxial silicon layer, wherein a doping concentration of the second-type lightly doped epitaxial silicon layer is far less than that of the second-type doped epitaxial silicon layer and the second-type lightly doped epitaxial silicon layer has a special profile caused by a diffusion of dopant from the second-type lightly doped epitaxial silicon layer.

2. The bottom level structure of claim 1, wherein the dopant type of the second-type doped epitaxial silicon layer is a p-type or an n-type.

3. The bottom level structure of claim 1, wherein a thickness of the crystalline silicon layer is about 200 Å to about 500 Å.

4. The bottom level structure of claim 1, wherein a thickness of the second-type doped epitaxial silicon layer is about 50 Å to about 100 Å.

5. The bottom level structure of claim 1, wherein a thickness of the second-type lightly doped epitaxial silicon layer is about 50 Å to about 100 Å.

* * * * *